United States Patent
Kobayashi et al.

[11] Patent Number: 6,037,699
[45] Date of Patent: Mar. 14, 2000

[54] SURFACE ACOUSTIC WAVE DEVICE

[75] Inventors: Yasumi Kobayashi, Yawata; Kuniyuki Matsui, Hirakata; Yasuhiro Hirao, Hirakata; Kosuke Takeuchi, Hirakata; Kenichi Shibata, Hashimoto; Yusuke Takahashi; Tateo Kondo, both of Higashiosaka; Yasutaka Shimizu, Tokyo, all of Japan

[73] Assignees: Sanyo Electric Co., Ltd., Moriguchi; Yasutaka Shimizu, Tokyo, both of Japan

[21] Appl. No.: 09/004,778

[22] Filed: Jan. 9, 1998

Related U.S. Application Data

[62] Division of application No. 08/692,403, Apr. 9, 1996, Pat. No. 5,760,522.

[30] Foreign Application Priority Data

Apr. 10, 1995 [JP] Japan ..................................... 7-109979

[51] Int. Cl.[7] ............................................................. H01L 41/08
[52] U.S. Cl. ............................................................. 310/313 A
[58] Field of Search ............................. 310/313 A, 313 R

[56] References Cited

U.S. PATENT DOCUMENTS

| | | |
|---|---|---|
| Re. 35,204 | 4/1996 | Lewis . |
| 3,965,444 | 6/1976 | Willingham et al. . |
| 4,016,440 | 4/1977 | Wagers ................................. 310/313 A |
| 4,342,012 | 7/1982 | Inaba et al. . |
| 4,345,176 | 8/1982 | Grudkowski et al. . |
| 4,489,250 | 12/1984 | Ebata et al. . |
| 5,162,690 | 11/1992 | Ieki et al. . |
| 5,215,546 | 6/1993 | Cho et al. . |
| 5,434,465 | 7/1995 | Sato et al. . |
| 5,446,330 | 8/1995 | Eda et al. . |
| 5,506,552 | 4/1996 | Seki et al. . |
| 5,532,538 | 7/1996 | Jin et al. .............................. 310/313 R |
| 5,729,186 | 3/1998 | Seki et al. ................................. 333/194 |
| 5,854,527 | 12/1998 | Shimizu et al. ..................... 310/313 A |
| 5,896,636 | 4/1999 | Penuhuri .......................... 310/313 A X |

FOREIGN PATENT DOCUMENTS

| | | |
|---|---|---|
| 5-183380 | 7/1993 | Japan . |
| 6-69750 | 3/1994 | Japan . |
| 6-112763 | 4/1994 | Japan . |

*Primary Examiner*—Mark O. Budd
*Attorney, Agent, or Firm*—Armstrong, Westerman, Hattori, McLeland & Naughton

[57] ABSTRACT

The invention provides a surface acoustic wave device which has a thin film formed on a surface of a substrate adapted to excite longitudinal wave-type surface acoustic waves, longitudinal wave-type quasi surface acoustic waves or longitudinal wave-type surface skimming bulk waves to thereby give an increased electromechanical coupling coefficient and at the same time minimize the temperature coefficient of delay time. For example, in a surface acoustic wave device having an aluminum thin film formed on a surface of a lithium tantalate substrate, the direction of propagation of longitudinal wave-type quasi surface acoustic waves is (40 deg to 90 deg, 40 deg to 90 deg, 0 deg to 60 deg) as expressed in Eulerian angles and within a range equivalent thereto, and the product of wave number of longitudinal wave-type quasi surface acoustic waves and the thickness of the thin film is at least 1.0, preferably in the range of 1.3 to 2.0. The device provided exhibits higher performance than in the paior art.

4 Claims, 7 Drawing Sheets

SURFACE ACOUSTIC WAVE DEVICE

CONTINUING DATA

This application is a division of Ser. No. 08/629,403 filed Apr. 9, 1996, now U.S. Pat. No. 5,760,522 issued Jun. 2, 1998.

FIELD OF THE INVENTION

The present invention relates to surface acoustic wave devices comprising a substrate adapted to excite surface acoustic waves wherein the longitudinal wave component predominates over the shear wave component, quasi surface acoustic waves wherein the longitudinal wave component predominates over the shear wave component, or surface skimming bulk waves wherein the longitudinal wave component predominates over the shear wave component.

BACKGROUND OF THE INVENTION

In recent years, surface acoustic wave devices have found wide application in communication devices such as a motor vehicle telephones as circuit elements of resonator filters, signal processing delay lines, etc. For example, FIG. 13 shows a surface acoustic wave device comprising interdigital electrodes 2 and latticelike reflectors 3, 3 which are formed on the surface of a piezoelectric substrate 1. The device converts electric signals to surface acoustic waves and vice versa.

Surface acoustic waves are surface waves which literally propagate along the surface of an elastic body, and the energy thereof is not radiated into the substrate. A plurality of modes of excitation have been discovered as such surface acoustic waves. For example, already known are the Rayleigh wave, Sezawa wave, Love wave, electroacoustic wave, etc.

In the Rayleigh and Sezawa waves, predominant are both a longitudinal wave component having a displacement in the same direction as the direction of propagation and a shear wave component having a displacement depthwise of the substrate. On the other hand, predominant in the Love wave and the electroacoustic wave is a shear wave component having a displacement in parallel to the substrate surface and perpendicular to the propagation direction. While three kinds of bulk waves, i.e., "slow shear wave", "fast shear wave" and "longitudinal wave" are present in the piezoelectric substrate, the surface acoustic waves propagate at a phase velocity lower than that of the "slow shear wave".

Also known are elastic waves which propagate along the surface of an elastic body while radiating energy depthwise of the body. These waves are called quasi surface acoustic waves or leaky surface acoustic waves. The quasi surface acoustic wave initially discovered comprises a predominant shear wave component having a displacement in parallel to the substrate surface and perpendicular to the propagation direction, and is intermediate between the "slow shear wave" and the "fast shear wave" in phase velocity.

Quasi surface acoustic waves having a predominant longitudinal wave component are discovered in recent years one after another (see JP-A-112763/1994 and proceedings of the 15th Symposium on Fundamentals and Applications of Ultrasonic Electronics, 1994, pp. 185–186). These quasi surface acoustic waves having a predominant longitudinal wave component are intermediate between the "fast shear wave" and the "longitudinal wave in phase velocity".

On the other hand, there is a case wherein bulk waves propagating along and close to the surface of a substrate are excited by interdigital electrodes and detected by other interdigital electrodes on the same substrate. Such bulk waves are termed surface skimming bulk waves. It is thought that there are three kinds of surface skimming bulk waves in corresponding relation with the usual bulk waves. However, mainly handled at present is the surface skimming bulk wave which comprises a predominant shear wave component having a displacement in parallel to the substrate surface and perpendicular to the propagation direction.

The characteristics of elastic waves include acoustic velocity, propagation loss, temperature characteristics of delay time and electromechanical coupling coefficient. These characteristics relate directly to the design parameters of the circuit to which the surface acoustic wave device is applied.

The period (center-to-center distance) of the electrode fingers of interdigital electrodes or latticelike reflectors has a value which is ½ of the wavelength $\lambda$ of elastic waves, so that at a constant frequency, the smaller the acoustic velocity, the smaller is the wavelength and the more difficult are the electrodes to fabricate. It is therefore desired that the acoustic velocity be greater.

The resonance sharpness of surface acoustic wave resonators and the insertion loss of surface acoustic wave filters are dependent directly on the propagation loss of surface acoustic waves. For this reason, the propagation loss should preferably be small.

The high-frequency devices for use in mobile communication are used at a frequency specified by the standard. Accordingly, it is not desirable that the frequency varies with variations in temperature. The temperature coefficient of delay time should preferably be small, therefore.

The electromechanical coupling coefficient represents a capacity to convert the energy of an input electric signal into the energy of surface acoustic waves. When the interdigital electrodes have a sufficiently increased number of electrode fingers, elastic waves of desired energy can be excited even if the electromechanical coupling coefficient is small, whereas the interdigital electrodes then have an increased electrical capacity, which presents difficulty in impedance matching with an external circuit, necessitating an additional matching circuit for impedance matching. Further it is known that the number of electrode fingers of interdigital electrodes is approximately in inverse proportion to the operating frequency range of the surface acoustic wave device, such that an increase in the number of electrode fingers limits the realizable characteristics to a narrow frequency range. Accordingly, the electromechanical coupling coefficient is preferably great.

Already known are substrate conditions (e.g., the relationship between the crystal axis and the direction of propagation of surface acoustic waves) and electrode conditions (e.g., the center-to center distance and film thickness of the electrode fingers) for improving the foregoing characteristics in connection with elastic waves (such as the Rayleigh wave and Sezawa wave) which comprise two predominant components, i.e., a shear wave component having a depthwise displacement and a longitudinal wave component, and elastic waves (such as the electroacoustic wave, Love wave, quasi surface acoustic wave of the shear wave type and surface skimming bulk wave of the shear wave type) which comprise a predominant shear wave component having a displacement in parallel to the surface and perpendicular to the propagation direction (Proceedings of the 1994 IEICE (Institute of Electronics, Information and Communication Engineers) Spring Conference, "A-438", "A-437", "A-438", Japanese Journal of Applied Physics, vol. 29 (1990) Supplement 29-1, pp. 119–121, Japanese Journal of Applied Physics, vol. 30 (1991) Supplement 30-1, pp. 143–145, etc.).

However, the requirements of the substrate and electrodes for improving the above characteristics still remain to be clarified for surface acoustic waves wherein the longitudinal wave component predominates over the shear wave component (longitudinal wave-type surface acoustic waves), quasi surface acoustic waves wherein the longitudinal wave component predominates over the shear wave component (longitudinal wave-type quasi surface acoustic waves) and surface skimming bulk waves wherein the longitudinal wave component predominates over the shear wave component (longitudinal wave-type surface skimming bulk waves).

SUMMARY OF THE INVENTION

An object of the present invention is to clarify the requirements of the substrate and electrodes for improving the elastic wave characteristics of surface acoustic wave devices comprising a substrate which is adapted to excite longitudinal wave-type surface acoustic waves, longitudinal wave-type quasi surface acoustic waves or longitudinal wave-type surface skimming bulk waves, and to provide surface acoustic wave devices which are improved over conventional devices in performance.

The present invention provides a surface acoustic wave device which comprises a substrate adapted to excite longitudinal wave-type surface acoustic waves, longitudinal wave-type quasi surface acoustic waves or longitudinal wave-type surface skimming bulk waves and in which a thin film is formed on a surface of the substrate to thereby give the device improved characteristics of propagating longitudinal wave-type surface acoustic waves, longitudinal wave-type quasi surface acoustic waves or longitudinal wave-type surface skimming bulk waves.

More specifically, the thin film on the substrate is made of a metal, and exciting electrodes are formed by the thin film.

The invention provides a surface acoustic wave device which comprises a substrate of lithium tantalate ($LiTaO_3$) and a thin film formed on a surface of the substrate and comprising aluminum or an alloy consisting mainly of aluminum, and in which the direction of propagation of longitudinal wave-type surface acoustic waves, longitudinal wave-type quasi surface acoustic waves or longitudinal wave-type surface skimming bulk waves is (40 deg to 90 deg, 40 deg to 90 deg, 0 deg to 60 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 1.0, preferably in the range of 1.3 to 2.0.

The invention also provides a surface acoustic wave device which comprises a substrate of lithium tantalate and a thin film formed on a surface of the substrate and comprising gold or an alloy consisting mainly of gold, and in which the direction of propagation of longitudinal wave-type surface acoustic waves, longitudinal wave-type quasi surface acoustic waves or longitudinal wave-type surface skimming bulk waves is (40 deg to 90 deg, 40 deg to 90 deg, 0 deg to 60 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 0.05, preferably in the range of 1.0 to 1.4.

The invention further provides a surface acoustic wave device which comprises a substrate of lithium niobate ($LiNbO_3$) and a thin film formed on a surface of the substrate and comprising aluminum or an alloy consisting mainly of aluminum, and in which the direction of propagation of longitudinal wave-type surface acoustic waves, longitudinal wave-type quasi surface acoustic waves or longitudinal wave-type surface skimming bulk waves is (40 deg to 90 deg, 40 deg to 90 deg, 0 deg to 60 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 0.3, preferably in the range of 1.0 to 2.0.

The invention further provides a surface acoustic wave device which comprises a substrate of lithium niobate and a thin film formed on a surface of the substrate and comprising gold or an alloy consisting mainly of gold, and in which the direction of propagation of longitudinal wave-type surface acoustic waves, longitudinal wave-type quasi surface acoustic waves or longitudinal wave-type surface skimming bulk waves is (40 deg to 90 deg, 40 deg to 90 deg, 0 deg to 60 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 0.02, preferably in the range of 0.8 to 2.0.

The invention further provides a surface acoustic wave device which comprises a substrate of lithium tetraborate ($Li_2B_4O_7$) and a thin film formed on a surface of the substrate and comprising aluminum or an alloy consisting mainly of aluminum, and in which the direction of propagation of longitudinal wave-type surface acoustic waves, longitudinal wave-type quasi surface acoustic waves or longitudinal wave-type surface skimming bulk waves is (0 deg to 50 deg, 15 deg to 75 deg, 40 deg to 90 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 0.3, preferably up to 1.9.

The invention further provides a surface acoustic wave device which comprises a substrate of lithium tetraborate and a thin film formed on a surface of the substrate and comprising gold or an alloy consisting mainly of gold, and in which the direction of propagation of longitudinal wave-type surface acoustic waves, longitudinal wave-type quasi surface acoustic waves or longitudinal wave-type surface skimming bulk waves is (0 deg to 50 deg, 15 deg to 75 deg, 40 deg to 90 deg) as expressed in Eulerian angles and within a range equivalent thereto, the product of the wave number ($1/\mu m$) of longitudinal wave-type surface acoustic waves, longitudinal wave-type quasi surface acoustic waves or longitudinal wave-type surface skimming bulk waves and the thickness ($\mu m$) of the thin film being at least 0.02, preferably up to 0.15 or in the range of 0.4 to 2.0.

Longitudinal wave-type quasi surface acoustic waves have a major portion of their energy concentrated on a range of from the surface to a depth corresponding to several wavelengths. Accordingly, a thin film, when formed on the substrate, influences the characteristics of the elastic waves. For example, if the acoustic velocity of the thin film is lower than that of the substrate, the phase velocity of the longitudinal wave-type quasi surface acoustic waves decreases.

With interdigital electrodes and latticelike reflectors, a region of metal thin film providing an electrode finger alternates with a region of the other free surface. When the difference in phase velocity between these two regions increases, the electromechanical coupling coefficient also increases. Further the metal thin film has two effect to reduce the phase velocity, i.e., electrical short-circuiting effect and mass effect. The latter effect is dependent on the thickness of the thin film and the density of the metal.

Accordingly, the electromechanical coupling coefficient can be altered by changing the electrode-forming metal and varying the thickness of the electrode film.

The phase velocity of elastic waves further depends on temperature since the dielectric constant, piezoelectric constant, elastic constant and density of the piezoelectric substrate vary with temperature. The elastic constant and density of the thin film also vary with temperature. When the thin film is prepared from a suitable material with a suitable thickness, the temperature characteristics of the substrate material offset those of the thin film material, greatly decreasing the temperature coefficient of the surface acoustic wave device.

It is known that longitudinal wave-type quasi surface acoustic waves are usually faster than the "fast shear wave" and slower than the "longitudinal wave", whereas the slow shear wave component and the "fast shear wave" component of the quasi surface acoustic waves are unable to propagate in this phase velocity range, and are radiated into the substrate. However, if a thin film with a sufficiently low acoustic velocity and a thickness of not smaller than a certain value is formed on the surface of the piezoelectric substrate, the velocity of the quasi surface acoustic waves becomes lower than that of the fast shear wave . In this case, the "rapid shear" wave component is no longer radiated into the substrate, hence a reduced propagation loss. When the thickness is increased, the velocity decreases below that of the "slow shear wave", with the result that the longitudinal wave-type quasi acoustic waves become longitudinal wave-type surface acoustic waves. With bulk waves no longer radiated into the substrate, the propagation loss theoretically diminishes to zero.

The characteristics of longitudinal wave-type surface acoustic waves and longitudinal wave-type surface skimming bulk waves can be improved also by the same effects as described above for the longitudinal wave-type quasi surface acoustic waves.

In the case where longitudinal wave-type quasi surface acoustic waves and longitudinal wave-type surface skimming bulk waves appear under the same conditions on attenuation, the same effects as above are of course available.

With the surface acoustic wave device of the invention having a substrate adapted to excite longitudinal wave-type surface acoustic waves, longitudinal wave-type quasi surface acoustic waves or longitudinal wave-type surface skimming bulk waves, a thin film of suitable material and thickness is formed on a surface of the substrate, thereby providing an increased electromechanical coupling coefficient for surface acoustic waves, quasi surface acoustic waves or surface skimming bulk waves of the longitudinal wave type and minimizing the temperature coefficient of delay time.

DETAILED DESCRIPTION OF EMBODIMENTS

In connection with embodiments which comprise a substrate adapted to excite longitudinal wave-type quasi surface acoustic waves and made of lithium tantalate, lithium niobate or lithium tetraborate, and electrodes of aluminum or gold formed on the substrate, the requirements of the substrate and requirements of the electrodes will be clarified below for realizing an increased electromechanical coupling coefficient and a minimized temperature coefficient of delay time.

The characteristics of surface acoustic wave devices were evaluated by using a common analysis method already known (see, for example, J. J. Campbell, W. R. Jones, "A Method for Estimating Optimal Crystal Cuts and Propagation Directions for Excitation of Piezoelectric Surface Waves", IEEE Transaction on Sonics and Ultrasonics, vol, SU-15, No. 4, pp. 209–217, (1968)), constructing models of surface acoustic wave devices having a thin film over the entire surface area of the substrate, and calculating electromechanical coupling coefficients and temperature coefficients by computer simulation.

Figure 1:
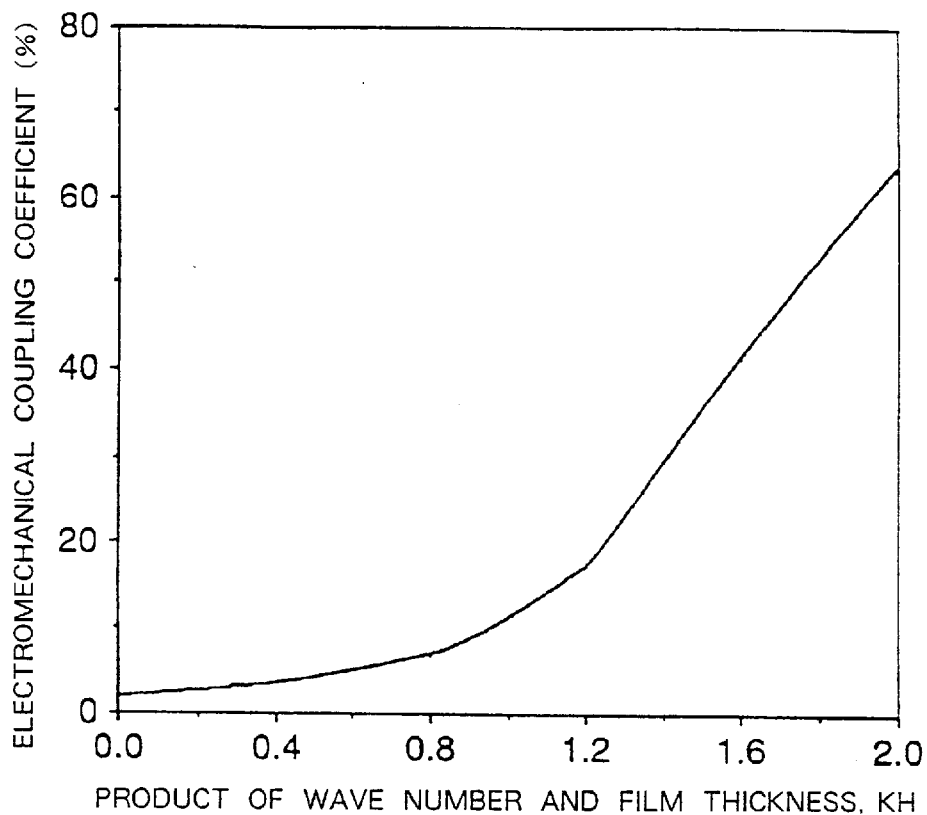
FIG. 1 is a graph showing the relationship between the KH parameter of longitudinal wave-type quasi surface acoustic waves and the electromechanical coupling coefficient thereof as established for a surface acoustic wave device comprising an aluminum thin film formed on a lithium tantalate substrate.

FIG. 1 shows characteristics of a surface acoustic wave device comprising an aluminum thin film on a lithium tantalate substrate by plotting the wave number K of longitudinal wave-type quasi surface acoustic waves ($K=2\pi/\lambda$) multiplied by the thickness H ($\mu$m) of the thin film, i.e., the product KH (hereinafter referred to as KH parameter), as abscissa and the electromechanical coupling coefficient of longitudinal wave-type quasi surface acoustic waves as ordinate.

The direction of propagation of longitudinal wave-type quasi surface acoustic waves is (40 deg to 90 deg, 40 deg to 90 deg, 0 deg to 60 deg), preferably (80 deg to 90 deg, 80 deg to 90 deg, 20 deg to 40 deg), more preferably (88 deg to 90 deg, 88 deg to 90 deg, 30 deg to 32 deg), most preferably (90 deg, 90 deg, 31 deg), as expressed in Eulerian angles. The superiority of these angle ranges is experimentally substantiated.

As apparent from FIG. 1, when the KH parameter is over about 1.0, the electromechanical coupling coefficient is at least 10% as desired for design. When the KH parameter is over about 1.3, the electromechanical coupling coefficient is at least 20%, which is more desirable. When the KH parameter is over about 1.7, the coupling coefficient is at least 50%, which is most desirable.

Figure 2:
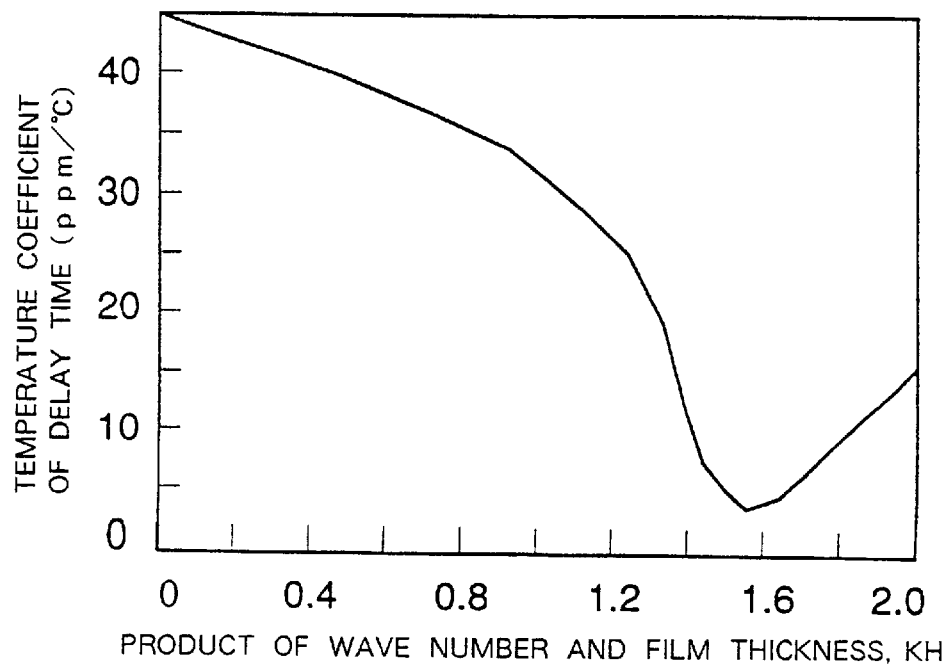
FIG. 2 is a graph showing the relationship between the KH parameter of longitudinal wave-type quasi surface acoustic waves and the temperature coefficient of delay time as established for the surface acoustic wave device.

FIG. 2 shows characteristics of the above surface acoustic wave device, with the KH parameter plotted as abscissa and with the temperature coefficient of delay time as ordinate. When the KH parameter is in the range of about 1.3 to about 2.0, the temperature coefficient of delay time is up to 20 ppm/° C. as desired for design. With the KH parameter in the range of about 1.4 to about 1.8, the temperature coefficient of delay time is up to 10 ppm/° C., which is more desirable. When the KH parameter is about 1.6, the temperature coefficient is 5 ppm/° C., which is most desirable.

Figure 3:
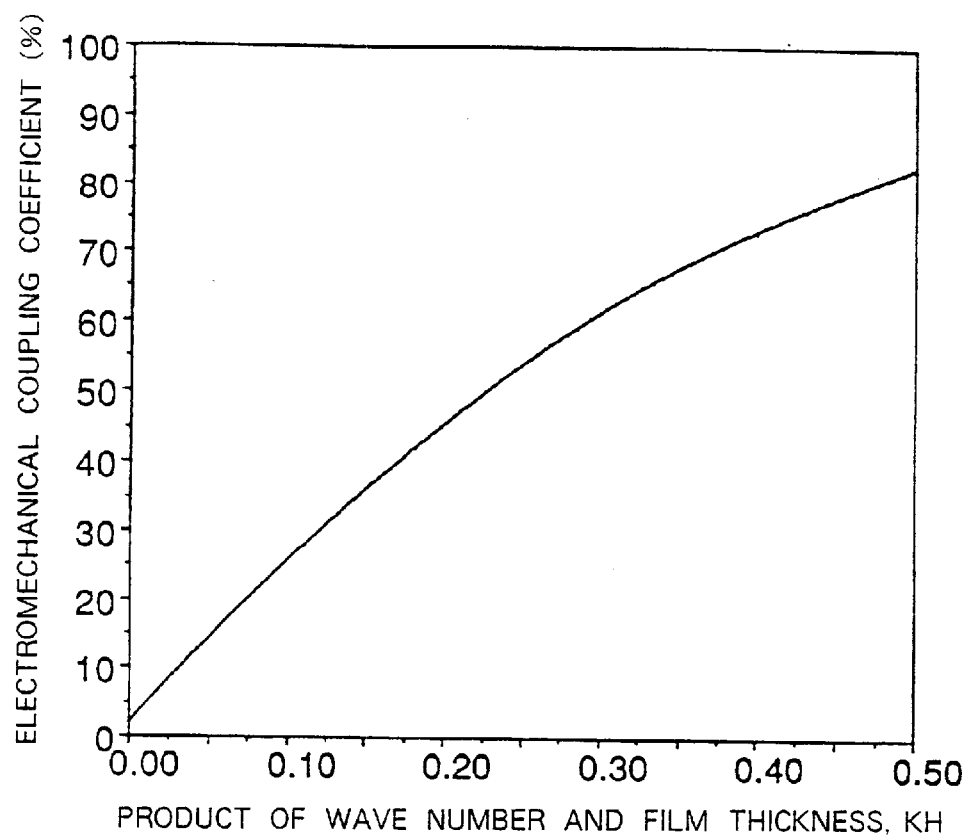
FIG. 3 is a graph showing the relationship between the KH parameter of longitudinal wave-type quasi surface acoustic waves and the electromechanical coupling coefficient thereof as established for a surface acoustic wave device comprising a gold thin film formed on a lithium tantalate substrate.

In FIG. 3, the KH parameter is plotted as abscissa, and the electromechanical coupling coefficient as ordinate, to show characteristics of a surface acoustic wave device comprising a gold thin film formed on a lithium tantalate substrate.

the direction of propagation of longitudinal wave-type quasi surface acoustic waves is (40 deg to 90 deg, 40 deg to 90 deg, 0 deg to 60 deg) preferably (80 deg to 90 deg, 80 deg to 90 deg, 20 deg to 40 deg), more preferably (88 deg to 90 deg, 88 deg to 90 deg, 30 deg to 32 deg), most preferably (90 deg, 90 deg, 31 deg), as expressed in Eulerian angles. The superiority of these angular ranges is experimentally substantiated.

As apparent from FIG. 3, when the KH parameter is over about 0.05, the electromechanical coupling coefficient is at least 10% as desired for design. When the KH parameter is over about 0.10, the electromechanical coupling coefficient is at least 20%, which is more desirable. When the KH parameter is over about 0.2, the coupling coefficient is at least 50%, which is most desirable.

Figure 4:
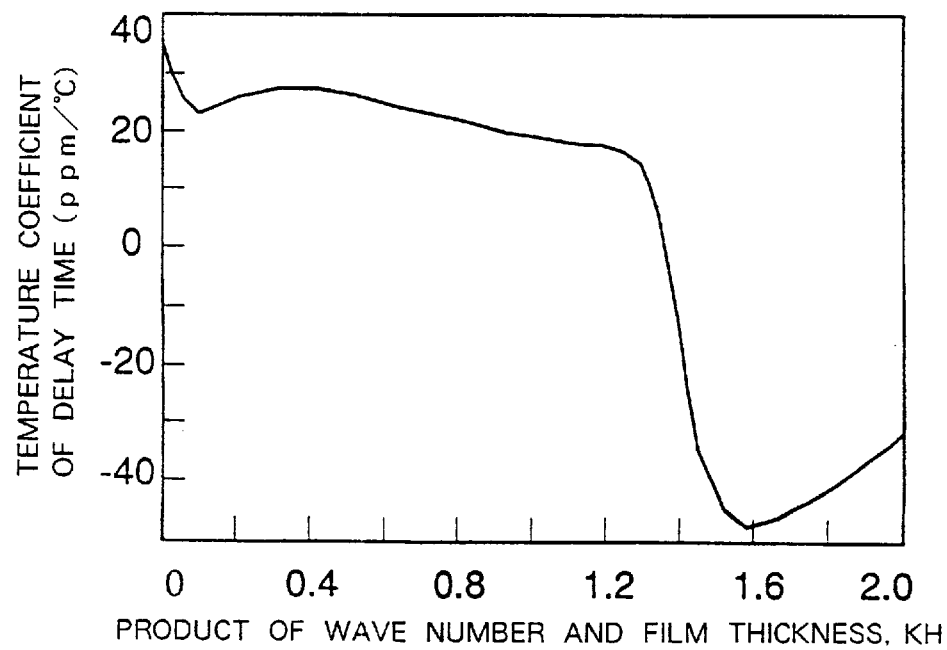
FIG. 4 is a graph showing the relationship between the KH parameter of longitudinal wave-type quasi surface acoustic waves and the temperature coefficient of delay time as established for the surface acoustic wave device.

FIG. 4 shows characteristics of the above surface acoustic wave device, with the KH parameter plotted as abscissa and the temperature coefficient of delay time as ordinate. When the KH parameter is about 1.0 to about 1.4, the absolute value of the temperature coefficient of delay time is up to 20 ppm/° C. as desired for design. When the KH parameter is about 1.3 to about 1.4, the absolute value of the temperature coefficient of delay time is up to 10 ppm/° C., which is more desirable. When the product of the thickness of the gold film and the wave number of longitudinal wave-type quasi surface acoustic waves is about 1.3, the temperature characteristic of delay time is approximately 0 ppm/° C., which is most desirable.

If the KH parameter is at least 0.6, the phase velocity becomes lower than those of the fast shear wave and the "slow shear wave", so that in actuality the longitudinal wave-type quasi surface acoustic waves are not such but behave as longitudinal wave-type surface acoustic waves. Needless to say, therefore, the propagation loss is nearly zero.

Figure 5:
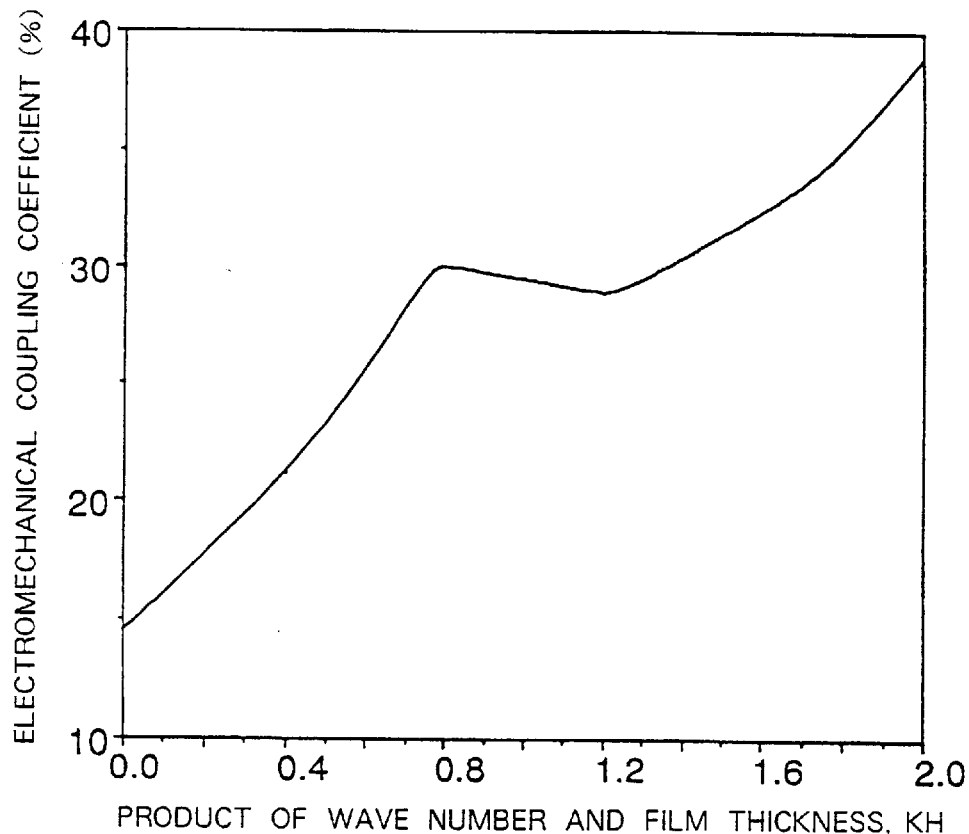
FIG. 5 is a graph showing the relationship between the KH parameter of longitudinal wave-type quasi surface acoustic waves and the electromechanical coupling coefficient thereof as established for a surface acoustic wave device comprising an aluminum thin film formed on a lithium niobate substrate.

FIG. 5 wherein the KH parameter is plotted as abscissa, and the-electromechanical coupling coefficient of longitudinal wave-type quasi surface acoustic waves as ordinate shows characteristics of a surface acoustic wave device comprising an aluminum thin film formed on a lithium niobate substrate.

The direction of propagation of longitudinal wave-type quasi surface acoustic waves is (40 deg to 90 deg, 40 deg to 90 deg, 0 deg to 60 deg), preferably (80 deg to 90 deg, 80 deg to 90 deg, 20 deg to 40 deg), more preferably (88 deg to 90 deg, 88 deg to 90 deg, 36 deg to 38 deg), most preferably (90 deg, 90 deg, 37 deg, as expressed in Eulerian angles. The superiority of these angular ranges is experimentally substantiated.

As will be apparent from FIG. 5, when the KH parameter is at least about 0.3, the electromechanical coupling coefficient is in excess of 20% as desired for design. When the KH parameter is at least about 0.8, the electromechanical coupling coefficient has a more desirable value of at least 30%.

Figure 6:
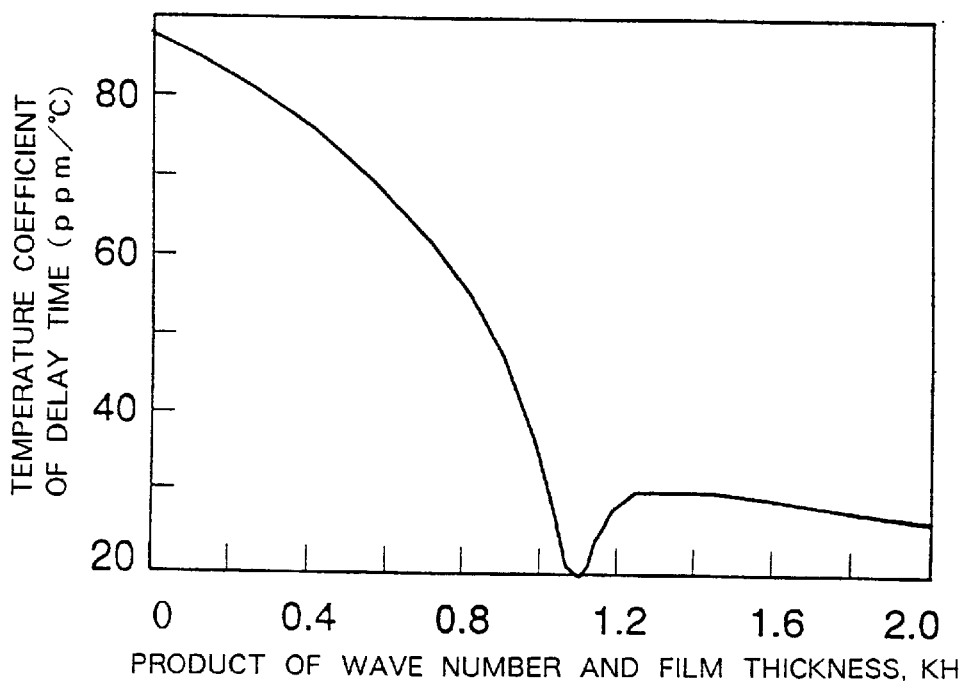
FIG. 6 is a graph showing the relationship between the KH parameter of longitudinal wave-type quasi surface acoustic waves and the temperature coefficient of delay time as established for the surface acoustic wave device.

FIG. 6 wherein the KH parameter is plotted as abscissa, and the temperature coefficient of delay time as ordinate shows characteristics of the surface acoustic wave device. When the KH parameter is about 1.0 to about 2.0, the temperature coefficient of delay time is up to 40 ppm/° C. as desired for design. When the KH parameter is about 1.0 to about 1.2, the temperature coefficient of delay time is up to 30 ppm/° C., which is more desirable. When the KH parameter is about 1.1, the temperature coefficient has the most desirable value of 20 ppm/° C.

Figure 7:
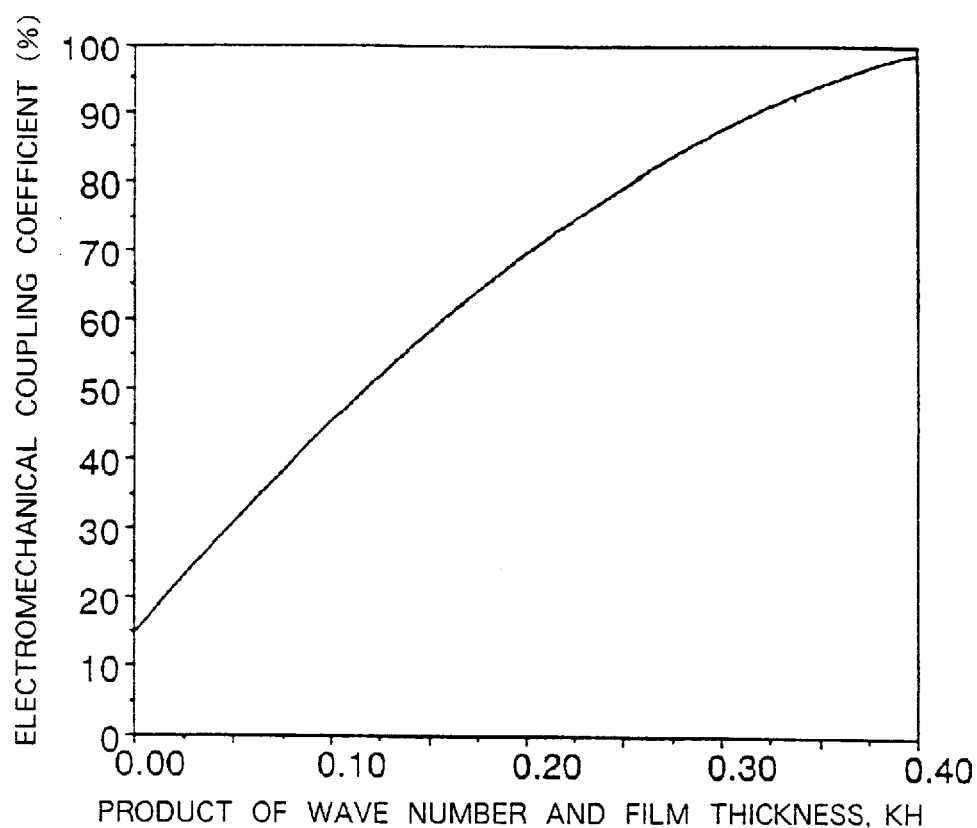
FIG. 7 is a graph showing the relationship between the KH parameter of longitudinal wave-type quasi surface acoustic waves and the electromechanical coupling coefficient thereof as established for a surface acoustic wave device comprising a gold thin film formed on a lithium niobate substrate.

FIG. 7, wherein the KH parameter is plotted as abscissa, and the electromechanical coupling coefficient of longitudinal wave-type quasi surface acoustic waves as ordinate, chows characteristics of a surface acoustic wave device comprising a gold thin film formed on a lithium niobate substrate.

The direction of propagation of longitudinal wave-type quasi surface acoustic waves is (40 deg to 90 deg, 40 deg to 90 deg, 0 deg to 60 deg), preferably (80 deg to 90 deg, 80 deg to 90 deg, 20 deg to 40 deg), more preferably (88 deg to 90 deg, 88 deg to 90 deg, 36 deg to 38 deg), most preferably (90 deg, 90 deg, 37 deg), as expressed in Eulerian angles. The superiority of these angular ranges is experimentally substantiated.

As will be apparent from FIG. 7, when the KH parameter is at least about 0.02, the electromechanical coupling coefficient is at least 20% as desired for design. When the KH parameter is at least about 0.05, the coupling coefficient has a more desirable value of at least 30%.

Figure 8:
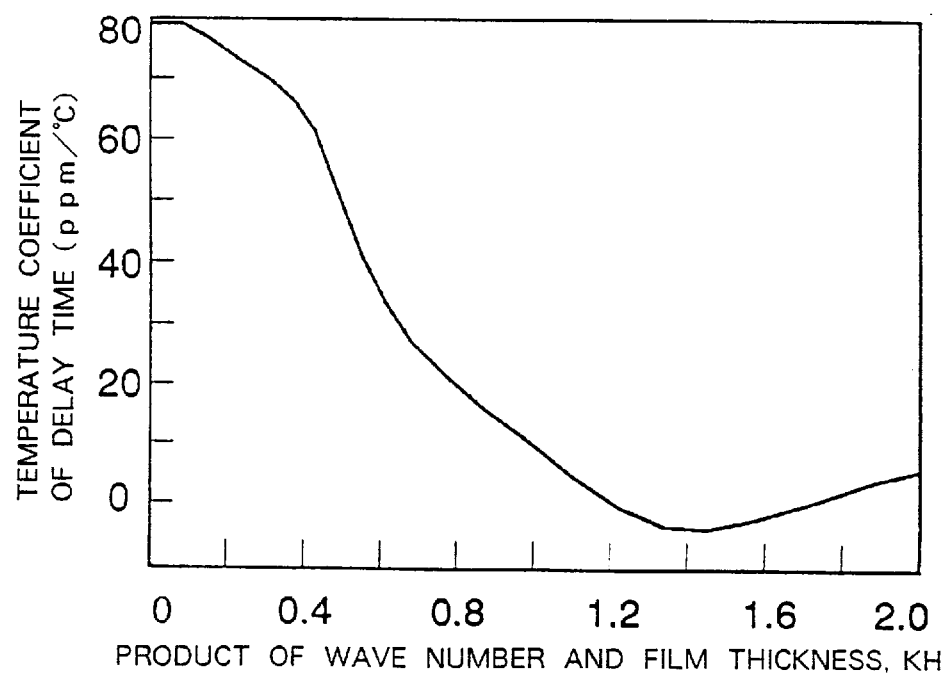
FIG. 8 is a graph showing the relationship between the KH parameter of longitudinal wave-type quasi surface acoustic waves and the temperature coefficient of delay time as established for the surface acoustic wave device.

FIG. 8 wherein the KH parameter is plotted as abscissa, and the temperature coefficient of delay time as ordinate shows characteristics of the surface acoustic wave device. When the KH parameter is about 0.8 to about 2.0, the absolute value of the temperature coefficient of delay time is up to 20 ppm/° C. as desired for design. When the KH parameter is about 1.0 to about 2.0, the temperature coefficient of delay time has a more desirable value of up to 10 ppm/° C. When the KH parameter, i.e., the product of the thickness of the gold film and the wave number of longitudinal wave-type quasi surface acoustic waves, is about 1.2 to 1.6, the temperature coefficient is nearly 0 ppm/° C. which is most desirable.

If the KH parameter is at least 0.3, the phase velocity becomes lower than those of the "fast shear wave" and the "slow shear wave", so that in actuality the longitudinal wave-type quasi surface acoustic waves are not such but behave as longitudinal wave-type surface acoustic waves. Needless to say, therefore, the propagation loss is then nearly zero.

Figure 9:
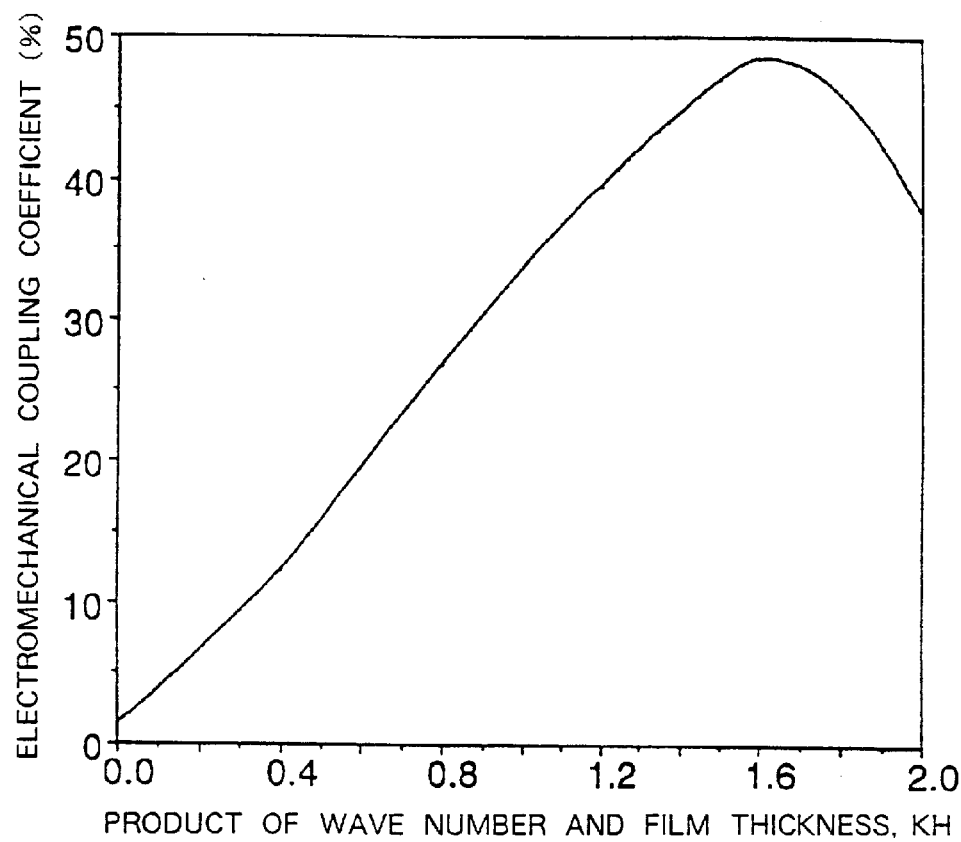
FIG. 9 is a graph showing the relationship between the KH parameter of longitudinal wave-type quasi surface acoustic waves and the electromechanical coupling coefficient thereof as established for a surface acoustic wave device comprising an aluminum thin film formed on a lithium tetraborate substrate.

FIG. 9 wherein the KH parameter is plotted as abscissa, and the electromechanical coupling coefficient as ordinate shows characteristics of a surface acoustic wave device comprising an aluminum thin film formed on a lithium tetraborate substrate.

The direction of propagation of longitudinal wave-type quasi surface acoustic waves is (0 deg to 50 deg, 15 deg to 75 deg, 40 deg to 90 deg), preferably (0 deg to 10 deg, 40 deg to 50 deg, 80 deg to 90 deg) ,more preferably (0 deg to 2 deg, 44 deg to 46 deg, 88 deg to 90 deg), most preferably (0 deg, 45 deg, 90 deg), as expressed in Eulerian angles. The superiority of these angular ranges is experimentally substantiated.

As will be apparent from FIG. 9, when the KH parameter is at least about 0.3, the electromechanical coupling coefficient is at least 10% as desired for design. When the KH parameter is at least about 0.6, the electromechanical coupling coefficient has a more desirable value of at least 20%. When the KH parameter is about 1.6, the coupling coefficient has the most desirable value of about 50%.

Figure 10:
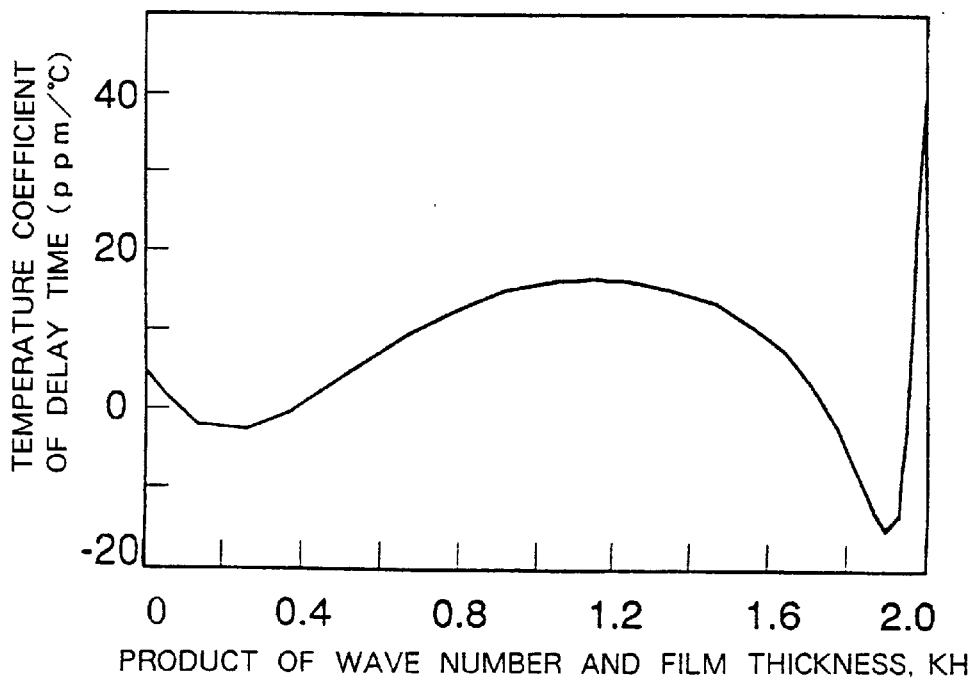
FIG. 10 is a graph showing the relationship between the KH parameter of longitudinal wave-type quasi surface acoustic waves and the temperature coefficient of delay time as established for the surface acoustic wave device.

FIG. 10 shows characteristics of the surface acoustic wave device, with the KH parameter plotted as abscissa, and the temperature coefficient of delay time as ordinate. When the KH parameter is up to about 1.9, the absolute value of the temperature coefficient of delay time is up to 20 ppm/° C. as desired for design. When the KH parameter is up to about 0.5, the temperature coefficient of delay time has a more desirable value of up to 5 ppm/° C. When the KH parameter is about 0.1, about 0.4, about 1.7 or about 1.95, the temperature coefficient is nearly 0 ppm/° C. which is most desirable.

When the KH parameter is set in the range of about 1.6 to about 1.95, both the electromechanical coupling coefficient and the temperature coefficient of delay time can be optimized.

Figure 11:
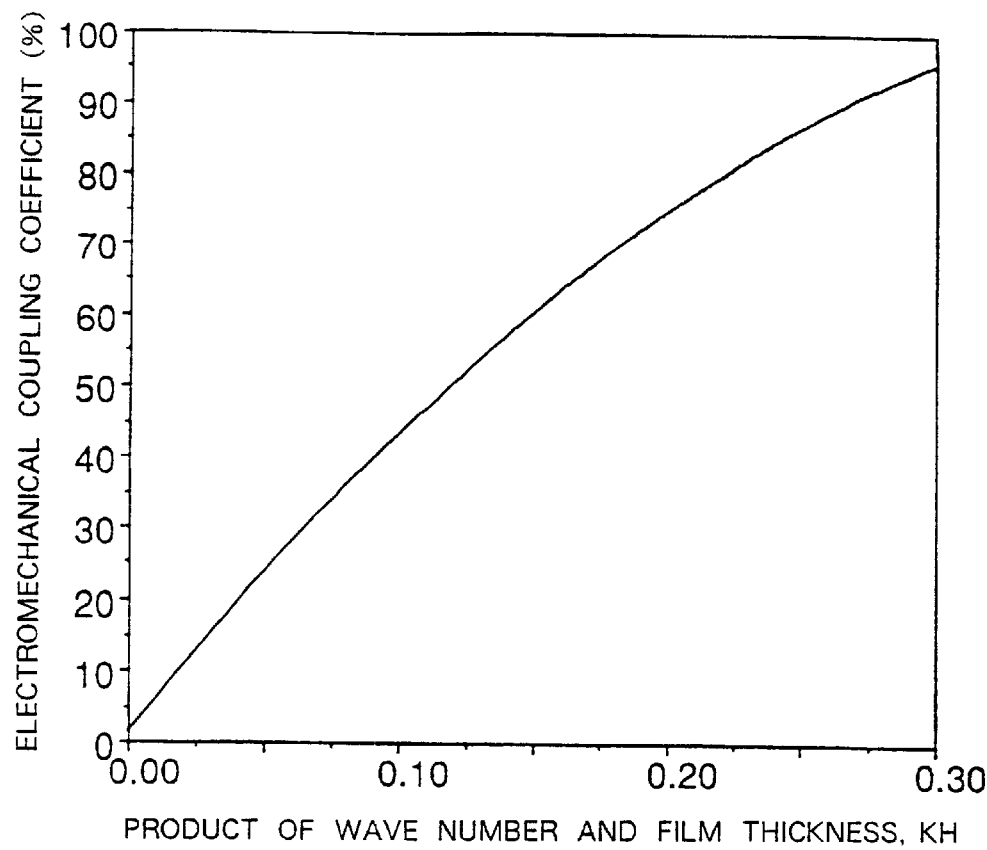
FIG. 11 is a graph showing the relationship between the KH parameter of longitudinal wave-type quasi surface acoustic waves and the electromechanical coupling coefficient thereof as established for a surface acoustic wave device comprising a gold thin film formed on a lithium tetraborate substrate.

FIG. 11 wherein the KH parameter is plotted as abscissa, and the electromechanical coupling coefficient as ordinate chows characteristics of a surface acoustic wave device comprising a gold thin film formed on a lithium tetraborate substrate.

The direction of propagation of longitudinal wave-type quasi surface acoustic waves is (0 deg to 50 deg, 15 deg to 75 deg, 40 deg to 90 deg), preferably (0 deg to 10 deg, 40 deg to 50 deg, 80 deg to 90 deg), more preferably (0 deg to 2 deg, 44 deg to 46 deg, 88 deg to 90 deg), most preferably (0 deg, 45 deg, 90 deg), as expressed in Eulerian angles. The superiority of these angular ranges is experimentally substantiated.

As will be apparent from FIG. 11, when the KH parameter is at least about 0.02, the electromechanical coupling coefficient is at least 10% as desired for design. When the KH parameter is at least about 0.05, the electromechanical coupling coefficient has a more desirable value of at least 20%. When the KH parameter is at least about 0.1, the coupling coefficient has the most desirable value of at least 40%.

Figure 12:
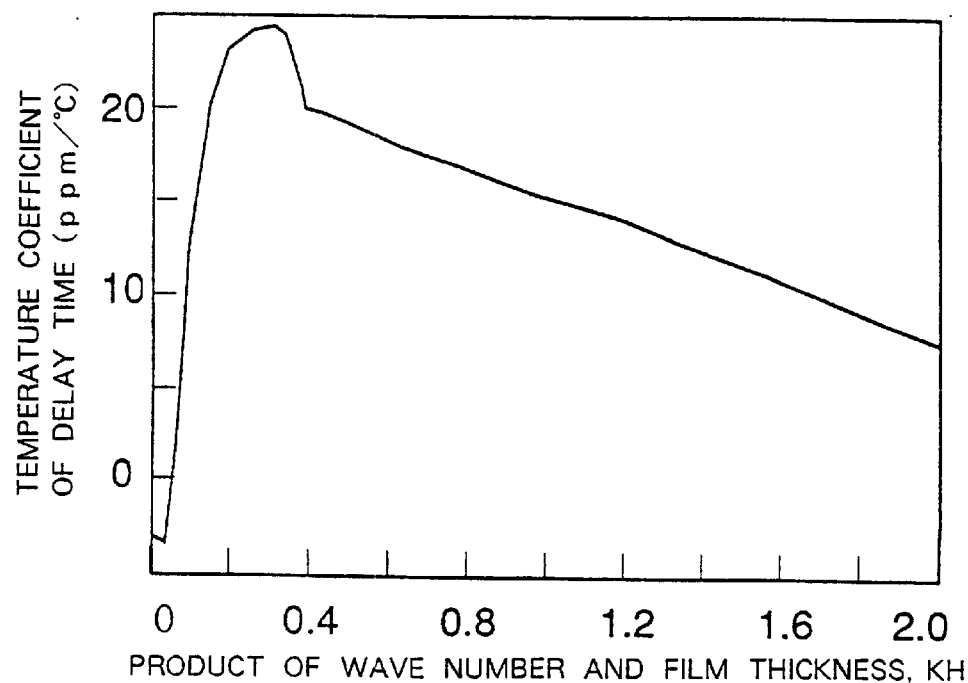
FIG. 12 is a graph showing the relationship between the KH parameter of longitudinal wave-type quasi surface acoustic waves and the temperature coefficient of delay time as established for the surface acoustic wave device.
Figure 13:
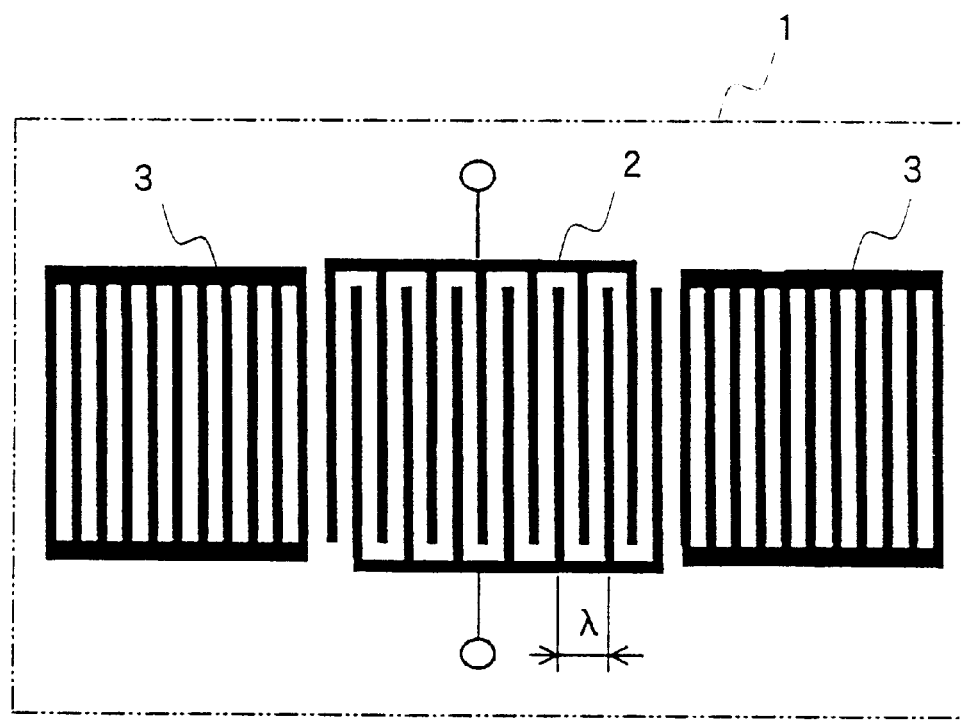
FIG. 13 is a diagram showing the construction of electrodes of a surface acoustic wave device.

FIG. 12 shows characteristics of the surface acoustic wave device, with the KH parameter plotted as abscissa and the temperature coefficient of delay time as ordinate. When the KH parameter is up to about 0.15 or about 0.4 to about 2.0, the temperature coefficient of delay time is up to 20 ppm/° C. as desired for design. When the KH parameter is up to about 0.1 or about 1.7 to about 2.0, the temperature coefficient of delay time has more desirable value of up to 10 ppm/° C. If the KH parameter is at least 0.2, the phase velocity is lower than that of the "fast shear wave" with no radiation of the "fast shear wave", hence a greatly diminished propagation loss. Further if the KH parameter is at least 0.3, the phase velocity becomes lower than that of the "slow shear wave", with the result that the longitudinal wave-type quasi surface acoustic waves are no longer such but behave as longitudinal wave-type surface acoustic waves. Needless to say, therefore, the propagation loss is then nearly zero.

In calculating the electromechanical coupling coefficients and the temperature coefficients of delay time by the aforementioned computer simulation, models are used wherein a thin film is formed over the entire surface area of a substrate. Accordingly, in establishing the relationship between the KH parameter and the temperature coefficient of delay time shown in each of FIG. 2, FIG. 4, FIG. 6, FIG. 8 and FIG. 10 for surface acoustic wave filters wherein interdigital electrodes are formed on the substrate surface, it is necessary to use the product of the wave number and the average film thickness of the electrode-forming region. The average film thickness of the electrode-forming region is calculated by multiplying the film thickness of the electrode by the duty ratio (width of the electrode finger/electrode period).

As described above, the surface acoustic wave device of the present invention comprises a substrate of lithium tantalate, lithium niobate or lithium tetraborate, and an aluminum or gold thin film of specified thickness formed on the substrate. This structure makes it possible to increase the electromechanical coupling coefficient of longitudinal wave-type quasi surface acoustic waves and to minimize the temperature coefficient of delay time at the same time.

The embodiments described above are intended to illustrate the present invention and should not be construed as limiting the invention as defined in the appended claims or reducing the scope thereof. The devices of the invention are not limited to the above embodiment in construction but can of course be modified variously without departing from the spirit of the invention set forth in the claims.

For example, surface acoustic wave devices which have a thin film formed on a substrate and prepared from a piezoelectric material different from that of the substrate, and electrodes formed on the thin film can be expected to have the same advantage as above due to the mass effect of the thin film.

What is claimed is:

1. A surface acoustic wave device comprising:

a substrate made of lithium niobate and adapted to excite surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component; and a thin film comprising aluminum or an alloy mainly comprising aluminum and being formed on a surface of the substrate, wherein the direction of the propagation of surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component is (40 deg to 90 deg, 40 deg to 90 deg, 0 deg to 60 deg) as expressed in Eulerian angles and within a range equivalent thereto, and the product of the wave number of the surface acoustic waves, quasi surface acoustic waves or surface skimming bulk waves of the type mentioned and the thickness of the thin film is in the range of 1.0 to 2.0.

2. A surface acoustic wave device comprising:

a substrate made of lithium niobate and adapted to excite surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component; and a thin film comprising gold or an alloy mainly comprising of gold and being formed on a surface of the substrate, wherein the direction of the propagation of surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component is (40 deg to 90 deg, 40 deg to 90 deg, 0 deg to 60 deg) as expressed in Eulerian angles and within a range equivalent thereto, and the product of the wave number of the surface acoustic waves, quasi surface acoustic waves or surface skimming bulk waves of the type mentioned and the thickness of the thin film is in the range of 0.8 to 2.0.

3. A surface acoustic wave device comprising a substrate of lithium niobate and exciting electrodes formed on a surface of the substrate and comprising aluminum or an alloy consisting mainly of aluminum, the surface acoustic wave device being characterized in that the electrodes are so formed that the direction of propagation of surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component is (40 deg to 90 deg, 40 deg to 90 deg, 0 deg to 60 deg) as expressed in Eulerian angles and within a range equivalent thereto, and the product of the wave number of the surface acoustic waves, quasi surface acoustic waves or surface skimming bulk waves of the type mentioned and an average film thickness of an electrode-forming region being in the range of 1.0 to 2.0.

4. A surface acoustic wave device comprising a substrate of lithium niobate and exciting electrodes formed on a surface of the substrate and comprising gold or an alloy consisting mainly of gold, the surface acoustic wave device being characterized in that the electrodes are so formed that the direction of propagation of surface acoustic waves in which a longitudinal wave component predominates over a shear wave component, quasi surface acoustic waves in which a longitudinal wave component predominates over a shear wave component, or surface skimming bulk waves in which a longitudinal wave component predominates over a shear wave component is (40 deg to 90 deg, 40 deg to 90 deg, 0 deg to 60 deg) as expressed in Eulerian angles and within a range equivalent thereto, and the product of the wave number of the surface acoustic waves, quasi surface acoustic waves or surface skimming bulk waves of the type mentioned and an average film thickness of an electrode-forming region being in the range of 0.8 to 2.0.

* * * * *